United States Patent [19]

Vanoli

[11] Patent Number: 5,859,561
[45] Date of Patent: Jan. 12, 1999

[54] DIFFERENTIAL LOAD AMPLIFIER FOR PIEZOELECTRIC SENSORS

[75] Inventor: Joël Marc Vanoli, Ermont, France

[73] Assignee: Societe Nationale D'Etude et de Construction de Moteurs D'aviation "Snecma", Paris, France

[21] Appl. No.: 729,276

[22] Filed: Oct. 10, 1996

[30] Foreign Application Priority Data

Oct. 11, 1995 [FR] France .................................. 95 11905

[51] Int. Cl.⁶ .............................. H03F 3/45; H01L 41/08
[52] U.S. Cl. ......................... 327/516; 327/509; 327/344; 327/100; 327/65; 327/563; 330/258; 310/319
[58] Field of Search .............................. 327/65, 561, 509, 327/517, 516, 336, 341, 344, 345, 63, 563, 361, 100, 103; 73/654, 105, 649; 340/870.3; 330/258, 253; 324/76.69, 729, 109; 310/319

[56] References Cited

U.S. PATENT DOCUMENTS

| | | | |
|---|---|---|---|
| 3,948,098 | 4/1976 | Richardson et al. | 340/870.3 |
| 4,902,970 | 2/1990 | Suquet | 327/100 |

FOREIGN PATENT DOCUMENTS 0 538 976 A1  4/1993  European Pat. Off. .
39 18 407 A1  12/1990  Germany .

OTHER PUBLICATIONS

Louis DE PIAN, et al., "Active Filters: Part 4 Approaching the Ideal NIC", Electronics, vol. 41, No. 19, Sep. 16, 1968, New York, pp. 105–108.

*Primary Examiner*—Dinh Le
*Attorney, Agent, or Firm*—Oblon, Spivak, McClelland, Maier & Neustadt, P.C.

[57] ABSTRACT

A differential load amplifier for receiving two measurement currents from a differential piezoelectric sensor and outputting a voltage proportional to a useful signal measured by the sensor. The differential load amplifier includes a subtraction device for determining a difference signal between the two measurement currents received from the sensor, and an integration device including and an integration capacitor for integrating the difference signal determined by the subtraction device. The subtraction device includes a negative immitance impedance converter, and the integration device includes an operational amplifier connected as an integrator. The subtraction and integration devices may also be implemented by a differential current amplifier and an integration capacitor, respectively.

8 Claims, 1 Drawing Sheet

DIFFERENTIAL LOAD AMPLIFIER FOR PIEZOELECTRIC SENSORS

BACKGROUND OF THE INVENTION

1. Field of the Invention

The invention relates to a differential load amplifier for a piezoelectric sensor. The invention is applicable to all devices utilizing piezoelectric sensors, and particularly to devices for measuring the vibrations of an engine by means of a piezoelectric accelerometer.

2. Summary of the Prior Art

It is known to measure the vibrations of an engine by means of a piezoelectric sensor associated with a load amplifier, the purpose of the load amplifier being to convert into a voltage the electrical load delivered by the piezoelectric sensor. In the case of equipment on an engine or in an industrial environment, an unwanted signal, termed a common mode voltage, generally superimposes itself on the signal to be measured, and elimination of the unwanted signal is achieved by using a differential structure comprising a differential piezoelectric sensor in association with a differential load amplifier. The known differential load amplifiers usually include two operational amplifiers mounted as integrators and require a strict pairing of two integration capacitors, which can be achieved only by means of a lengthy and costly sorting of components.

SUMMARY OF THE INVENTION

It is an object of the invention to provide a differential load amplifier capable of converting the electrical load delivered by a differential piezoelectric sensor into a voltage by means of an integrator device using only one integration capacitor, while at the same time rejecting any common mode voltage which might become superimposed upon the useful signal to be measured.

Accordingly, the invention provides a differential load amplifier for a differential piezoelectric sensor having two outputs delivering two measurement currents, said differential load amplifier comprising two inputs for connection to said two outputs of said piezoelectric sensor, subtraction means for providing a current representing the difference between said two measurement currents delivered to said two inputs by said two outputs of said differential piezoelectric sensor, and integration means having an input for receiving said current provided by said subtraction means, said integration means integrating said current and delivering an output voltage proportional to a useful signal measured by said piezoelectric sensor.

In a first embodiment of the invention, the subtraction means comprises a negative immitance impedance converter, known as "INIC", and the integration means comprises an operational amplifier in association with an integrating capacitor.

In a second embodiment of the invention, the subtraction and integration means may be formed by a differential current amplifier loaded by an integration capacitor.

In either case, the integration means of the differential load amplifier requires only one integration capacitor for integrating the signal received from the subtraction means and providing an output voltage proportional to a useful signal as measured by the piezoelectric sensor.

Other preferred features and advantages of the invention will become apparent from the following description of the preferred embodiments with reference to the attached drawings.

DESCRIPTION OF THE PREFERRED EMBODIMENTS

A piezoelectric sensor may be represented by an equivalent electrical diagram comprising a source of alternating voltage connected in series with a capacitor. The electrical load delivered by the piezoelectric sensor is proportional to the acceleration to be measured, the proportionality factor being equal to the sensitivity of the sensor.

Figure 1:
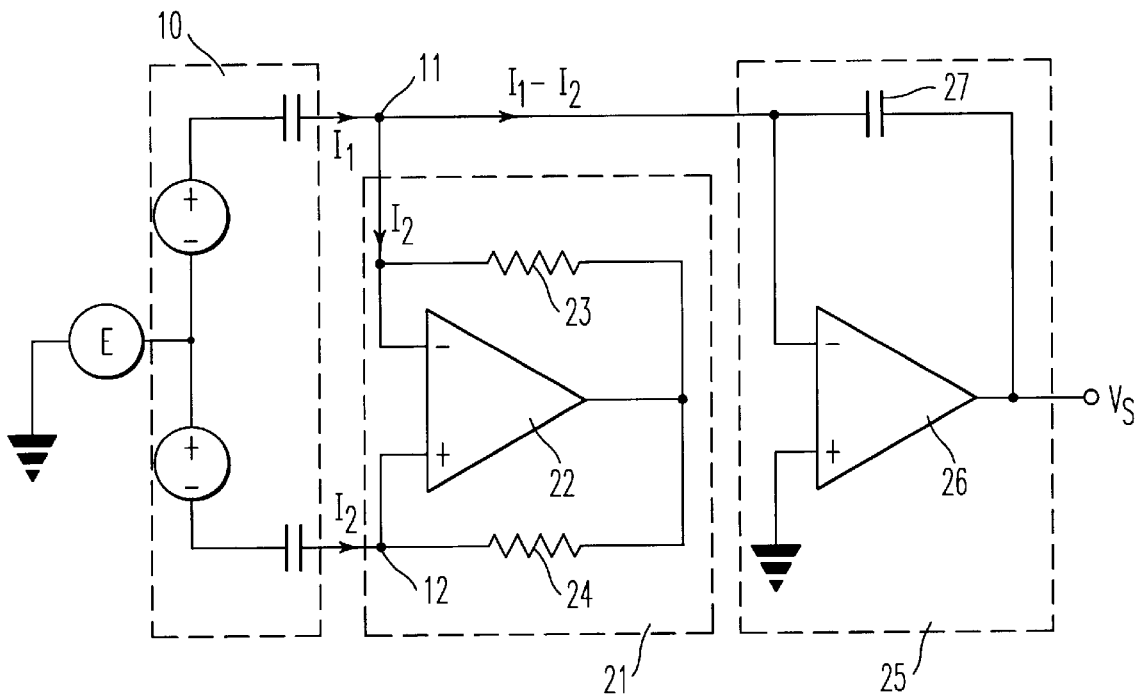
FIG. 1 shows an electrical circuit diagram of an assembly composed of a differential piezoelectric sensor and a differential load amplifier in accordance with a first embodiment of the invention; and, FIG. 2 shows an electrical circuit diagram of an assembly composed of a differential piezoelectric sensor and a differential load amplifier in accordance with a second embodiment of the invention.
Figure 2:
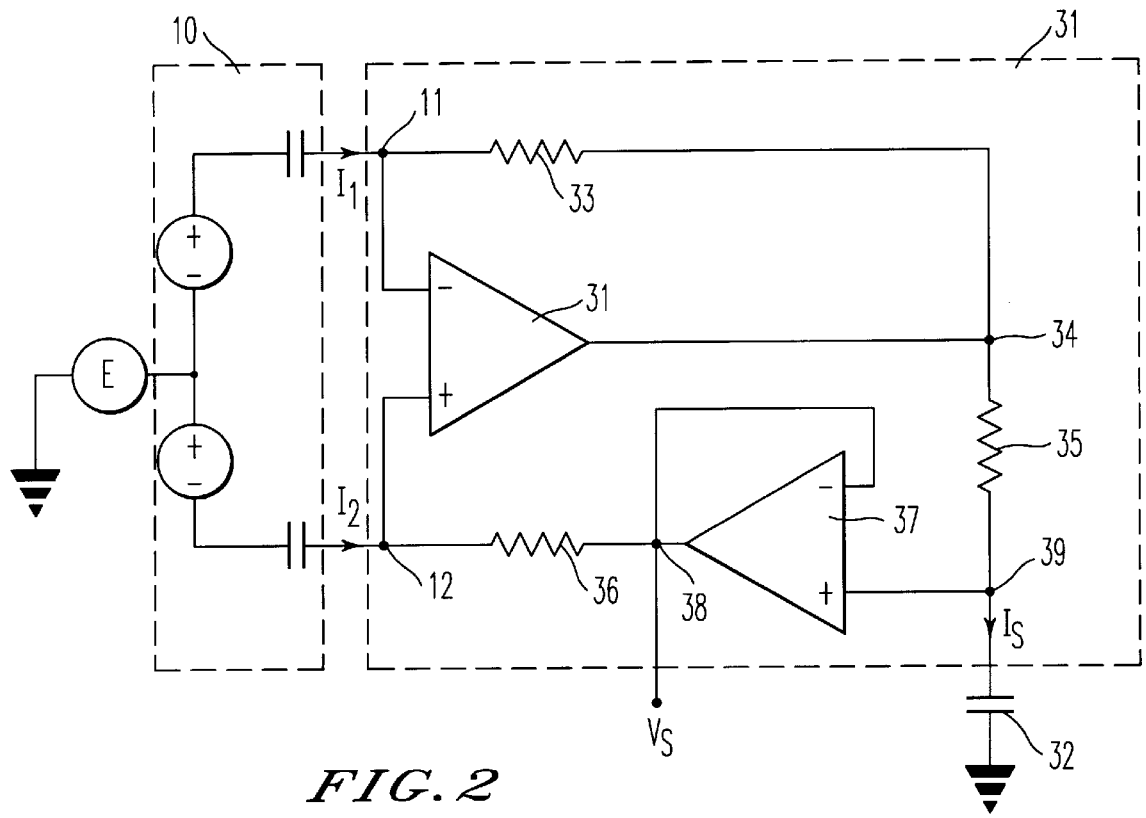

In the electrical circuit diagrams shown in FIGS. 1 and 2 the differential piezoelectric sensor is shown at 10, and a common mode voltage which is superimposed on the signal to be measured by the sensor is represented by a source of alternating voltage E connected between ground and the differential piezoelectric sensor 10. The sensor 10 comprises two parallel measuring paths, each of which includes a source of alternating voltage connected in series with a capacitor, the voltage sources and the capacitors having the same values in each path.

The electrical loads measured by the two measuring paths of the differential piezoelectric sensor 10 are represented by respective currents I1 and I2, and the difference (I1–I2) between these two currents corresponds to the useful signal measured by the sensor. The two currents I1 and I2 are delivered to respective outputs 11 and 12 of the sensor 10, and these two outputs 11, 12 are connected to two inputs of the differential load amplifier.

In the embodiment shown in FIG. 1, the differential load amplifier comprises a current reverser 21 having an input terminal and an output terminal connected respectively to the output terminals 11, 12 of the sensor 10, and an integrator 25 connected to the output terminal 11 of the sensor 10 and designed to deliver an output voltage VS proportional to the acceleration to be measured by the sensor. The current reverser 21 is designed to deliver at its output terminal the negative image of the current I2 presented at its input. The connection point between the output 11 of the sensor, the output of the current reverser 21, and the input of the integrator 25 constitutes a Kirchoff junction. Applying Kirchoff's law, the current applied to the input of the integrator 25 is equal to the difference (I1–I2) between the current I1 at the output 11 of the sensor 10 and the negative image of the current I2 at the output of the current reverser 21.

The current reverser 21 is formed by a negative immitance impedance converter known as an INIC, and comprises an operational amplifier 22 associated with two resistors 23, 24 of equal value. The resistor 23 is connected between the inverting input and the output of the amplifier 22, and the resistor 24 is connected between the non-inverting input and the output of the amplifier 22. Since the resistors have equal values, the current delivered at the output of the current reverser 21 is the negative image of the current I2 presented at its input.

The integrator 25 comprises an operational amplifier 26 in association with a capacitor 27 connected between the output and the inverting input of the amplifier 26. The non-inverting input of the amplifier 26 is connected to ground.

The current difference I1–I2 is applied to the non-inverting input of the amplifier 26 and integrated by the capacitor 27. The voltage VS delivered at the output of the integrator 25 is proportional to the acceleration measured by the sensor 10, the common mode signal having been eliminated by the pairing of the two resistors 23, 24 of the current reverser 21.

In the second embodiment of the invention shown in FIG. 2, the differential load amplifier comprises a differential current amplifier 31 loaded by an integration capacitor 32. The differential current amplifier 31 is designed to produce a current IS equal to the difference I1–I2 of the currents delivered by the two outputs 11, 12 of the sensor 10. This current difference is subsequently integrated by the integration capacitor 32 so as to deliver at its terminals a voltage proportional to the acceleration to be measured.

The differential current amplifier 31 comprises an operational amplifier 32 having an inverting input connected to the output 11 of the sensor 10, and a non-inverting input connected to the output 12 of the sensor 10. A resistor 33 is connected between the output 34 and the inverting input of the amplifier 32. Connected between the output 34 and the non-inverting input of the amplifier 32 are two resistors 35, 36 which are current-insulated from each other by a follower amplifier 37 which copies on its output 38 the voltage which is applied to its input 39.

The resistor 36 connected between the output 38 of the follower amplifier 37 and the non-inverting input of the operational amplifier 32 has the same value as the resistor 33. The resistor 35 connected between the output 34 of the operational amplifier 32 and the input 39 of the follower amplifier 37 may have a value different from that of the two resistors 33, 36.

The integration capacitor 32 is connected between a connection junction 39 and ground, the junction 39 being situated between the resistor 35 and the follower amplifier 37. The capacitor 32 is designed to integrate the current IS flowing through the resistor 35.

Current IS is equal to the difference I1–I2 of the currents delivered by the two outputs 11, 12 of the sensor 10, and the voltage across the terminals of the capacitor 32 is proportional to the acceleration measured by the sensor 10, the common mode signal having been eliminated by the pairing of the two resistors 33, 36 of the differential current amplifier 31.

The voltage VS measured at the output of the load amplifier is taken at a low impedance at the output of the follower amplifier 37 so as not to disturb the operation of the complete device.

I claim:

1. A differential load amplifier for receiving first and second measurement currents output from a differential piezoelectric sensor, said differential load amplifier comprising:

subtraction means, having first and second inputs for receiving said first and second measurement currents, respectively, said subtraction means providing, at said first input, a difference current representing a difference between said first and second measurement currents; and integration means for integrating said difference current, and having an input and an output for respectively receiving said difference current and delivering an output voltage proportional to said difference current.

2. The differential load amplifier according to claim 1, wherein said subtraction means comprises a current reverser for reversing said second measurement current at said second input so as to provide, at said first input, said difference current.

3. The differential load amplifier according to claim 2, wherein said current reverser comprises a negative immitance impedance converter, including, a first operational amplifier having inverting and non-inverting inputs corresponding to said first and second inputs of said subtraction means, respectively, and an output, a first resistor coupled between said inverting input and said output of said first operational amplifier, and a second resistor coupled between said non-inverting input and said output of said operational amplifier.

4. The differential load amplifier according to claim 2 or claim 3, wherein said integration means comprises:

a second operational amplifier having an output and input corresponding to said output and input of said integration means, respectively; and an integration capacitor coupled between said input and said output of said second operational amplifier.

5. The differential load amplifier according to claim 1, wherein:

said subtraction means comprises a differential current amplifier having inverting and non-inverting inputs corresponding to said first and second inputs of said subtraction means, respectively, and an output; and said integration means comprises a capacitor having first and second ends.

6. The differential load amplifier according to claim 5, wherein said differential current amplifier comprises:

an operational amplifier having an output and inverting and non-inverting inputs corresponding to said output and inverting and non-inverting inputs of said differential current amplifier, respectively;

a first resistor connected between said output and said inverting input of said operational amplifier;

a second resistor connected between said output of said operational amplifier and said first end of said capacitor; and a follower amplifier and a third resistor connected in series between said non-inverting input of said operational amplifier and said first end of said capacitor.

7. The differential load amplifier according to claim 6, wherein said first and third resistors have identical values.

8. The differential load amplifier according to claim 6 or claim 7, wherein said second end of said capacitor is connected to ground.

* * * * *